United States Patent
Zhang et al.

(10) Patent No.: US 8,105,467 B2
(45) Date of Patent: Jan. 31, 2012

(54) HIGH STRENGTH SPUTTERING TARGET FOR FORMING PHOSPHOR FILM IN ELECTROLUMINESCENCE ELEMENT

(75) Inventors: Shoubin Zhang, Sanda (JP); Shozo Komiyama, Sanda (JP); Akifumi Mishima, Sanda (JP)

(73) Assignee: Mitsubishi Materials Corporation, Tokyo (JP)

( * ) Notice: Subject to any disclaimer, the term of this patent is extended or adjusted under 35 U.S.C. 154(b) by 1119 days.

(21) Appl. No.: 11/913,780

(22) PCT Filed: May 1, 2006

(86) PCT No.: PCT/JP2006/309099
§ 371 (c)(1),
(2), (4) Date: Nov. 7, 2007

(87) PCT Pub. No.: WO2006/120961
PCT Pub. Date: Nov. 16, 2006

(65) Prior Publication Data
US 2009/0045052 A1   Feb. 19, 2009

(30) Foreign Application Priority Data

May 9, 2005 (JP) ................................. 2005-136221
Sep. 14, 2005 (JP) ................................. 2005-266634

(51) Int. Cl.
*C23C 14/34* (2006.01)
(52) U.S. Cl. ................ 204/192.13; 420/500; 420/415
(58) Field of Classification Search ............ 204/192.13; 420/528, 500, 415
See application file for complete search history.

(56) References Cited

U.S. PATENT DOCUMENTS

| 6,074,575 A | 6/2000 | Sugioka et al. |
| 2003/0000829 A1 | 1/2003 | Kosyachkov |
| 2005/0202162 A1 | 9/2005 | Xu et al. |

FOREIGN PATENT DOCUMENTS

| CN | 1926259 | 3/2007 |
| JP | 08-134440 | 5/1996 |
| JP | 08-138867 | 5/1996 |
| JP | 2001-118677 | 4/2001 |
| JP | 2001-297877 | 10/2001 |
| JP | 2004-533095 | 10/2004 |

OTHER PUBLICATIONS

Yanagida et al., "BaAl$_2$S4:Eu Thin Films Prepared by RF Sputtering", Technical Report of IEICE, Jan. 2005, pp. 21-24.
Miura et al.,"High-Luminance Blue-Emitting BaA12S4:Eu Thin-Film Electroluminescent Devices", Japanese Journal of Applied Physics, vol. 38, Part 2, No. 11B, Nov. 1999, pp. L1291-L1292.

*Primary Examiner* — Rodney McDonald
(74) *Attorney, Agent, or Firm* — Leason Ellis LLP

(57) ABSTRACT

Provided is a sputtering target for forming a phosphor film in an electroluminescence element, which can maintain high strength even when it is allowed to stand in the atmosphere for a long time. The target has a chemical composition of Al: 20 to 50 mass %, Eu: 1 to 10 mass %, and the remainder containing Ba and inevitable impurities, and has a structure wherein Ba in which Eu is solid-solubilized and Al form an intermetallic compound phase, wherein the intermetallic compound phase of Ba in which Eu is solid-solubilized and Al includes a $BaAl_4$ intermetallic compound phase and a $Ba_7Al_{13}$ intermetallic compound phase, and Eu forms a solid solution with Ba in the $BaAl_4$ intermetallic compound and in the $Ba_7Al_{13}$ intermetallic compound, respectively.

4 Claims, No Drawings

HIGH STRENGTH SPUTTERING TARGET FOR FORMING PHOSPHOR FILM IN ELECTROLUMINESCENCE ELEMENT

CROSS-REFERENCE TO PRIOR APPLICATION

This is a U.S. National Phase Application under 35 U.S.C. §371 of International Patent Application No. PCT/JP2006/309099 filed May 1, 2006, and claims the benefit of Japanese Patent Application Nos. 2005-136221, filed May 9, 2005 and 2005-266634, filed Sep. 14, 2005, all of which are incorporated by reference herein. The International Application was published in Japanese on Nov. 16, 2006 as WO 2006/120961 A1 under PCT Article 21(2).

TECHNICAL FIELD

The present invention relates to a sputtering target for forming by sputtering a phosphor film constituting an electroluminescence element which is used in displays of various electronics and information equipment. In particular, the invention relates to a sputtering target for forming a phosphor film in an electroluminescence element, that is for forming a europium-doped barium thioaluminate phosphor film ($BaAl_2S_4$:Eu) by a reactive sputtering method performed in an atmosphere containing $H_2S$ gas, while the target can maintain high strength even when it is allowed to stand in the atmosphere for a long time.

BACKGROUND ART

Recently, an electroluminescence element has come into use for displays of various electronics and information equipment, and such an electroluminescence element employs a phosphor film. The electroluminescence element generally has a constitution including a lower transparent electrode formed on a glass substrate, a first insulating film formed on the lower transparent electrode, a phosphor film formed on the first insulating film, a second insulating film formed on the phosphor film in the manner of covering the phosphor film with the second insulating film and the first insulating film, and an upper electrode formed on the second insulating film. This constitution is widely known.

The europium-doped barium thioaluminate phosphor film ($BaAl_2S_4$:Eu) is known as one of phosphor films used in the electroluminescence element. The europium-doped barium thioaluminate phosphor film is constituted by barium thioaluminate ($BaAl_2S_4$) serving as the host component and impurities including europium (Eu) which serve as the emission center. This europium-doped barium thioaluminate phosphor film is formed by first preparing a thin amorphous film by a two-pulse electron-beam evaporation deposition method with the use of a BaS pellet added with an $Al_2S_3$ pellet and $EuF_3$ as the vaporization source, and then subjecting to crystallization with heat treatment in an annealing furnace. However, in this method, the phosphor film needs to be treated with heat in a final process and the temperature for this heat treatment has to be as high as 900° C. or above. Accordingly, electrodes and insulating films constituting an electroluminescence element are adversely affected, and thus it has been difficult to obtain completely-crystallized Eu-added barium thioaluminate.

Thereupon, in recent years, there has been developed and proposed a method for producing a europium-doped barium thioaluminate phosphor film by an electron beam (EB) evaporation deposition method with the use of organometallic materials of triethylaluminum ($Al(C_2H_5)_3$), trimethylaluminum ($Al(CH_3)_3$), or triisobutylaluminum ($Al(i-C_4H_9)_3$), metal barium (Ba), any one of metal europium (Eu), europium chloride ($EuCl_3$), and europium fluoride ($EuF_3$), and hydrogen sulfide ($H_2S$), as the raw materials (see Patent Document 1). In addition, there is no description about the europium-doped barium thioaluminate phosphor film ($BaAl_2S_4$:Eu) itself, but it is generally known that a phosphor film in an electroluminescence element is formed by a multi-target sputtering method (see Patent Documents 2 and 3).

[Patent Document 1] Japanese Unexamined Patent Publication No. 2001-297877
[Patent Document 2] Japanese Unexamined Patent Publication No. 2001-118677
[Patent Document 3] Japanese Unexamined Patent Publication No. 8-138867

DISCLOSURE OF THE INVENTION

Problems to be Solved by the Invention

Recently, displays are getting bigger and accordingly an electroluminescence element needed for such large-screen displays is getting bigger. However, there are limitations on the production of a europium-doped barium thioaluminate phosphor film with large dimension by the evaporation deposition method, and it is more advantageous to form a thin film with a large dimension by a sputtering method than by an evaporation deposition method. Therefore, in recent years, a study on the production of a europium-doped barium thioaluminate phosphor film with a large dimension, which is used for a large-scale electroluminescence element, by a multi-target sputtering method, has been conducted.

However, when a europium-doped barium thioaluminate phosphor film is produced by the multi-target sputtering method, targets of elements of Ba, Al and Eu are required to be set together in a sputtering device to simultaneously sputter elements of Ba, Al, and Eu, and thus the size of the sputtering device has to be increased. In addition, since Ba and Eu are active metals that oxidization thereof cannot be prevented unless preserved in oil, it has thus been very difficult to handle targets of Ba and Eu in the atmosphere as they readily oxidize when allowed to stand in the atmosphere.

Further, it is difficult to form a europium-doped barium thioaluminate phosphor film ($BaAl_2S_4$:Eu) without causing any irregularity in the component composition even when the multi-target sputtering is performed with the use of targets of elements of Ba, Al, and Eu. Consequently, there can be considered a way of forming a europium-doped barium thioaluminate phosphor film ($BaAl_2S_4$:Eu) which includes preparing a mixed powder by blending and mixing elemental powders of Ba, Al, and Eu to give a composition including Al: 20 to 50 mass %, Eu: 1 to 10 mass %, and the remainder containing Ba which is set considering the film properties; press molding the mixed powder and further subjecting to sintering or hot pressing in a vacuum to prepare a target; and carrying out sputtering in a hydrogen sulfide atmosphere with the use of this target.

However, the target obtained by blending and mixing elemental powders of Ba, Al, and Eu to give the composition including Al: 20 to 50 mass %, Eu: 1 to 10 mass %, and the remainder containing Ba, press molding and thereafter subjecting to sintering or hot pressing in a vacuum, has an easily oxidizable Ba powder and Eu powder in the basis material thereof. As a result, there is caused a problem in that the target is oxidized in a short period of time when it is allowed to stand in the atmosphere and the target is oxidized while setting the prepared target in a sputtering device and before starting a sputtering, thereby extremely deteriorating the strength of the target which thus cannot be used as a target for sputtering.

It is an object of the invention to provide a sputtering target for forming a phosphor film in an electroluminescence element, which can maintain high strength even when it is allowed to stand in the atmosphere for a long time.

Means for Solving the Problems

The present inventors have conducted extensive studies to develop a sputtering target for forming a phosphor film in an electroluminescence element, which can maintain high strength even when it is allowed to stand in the atmosphere for a long time, and as a result, they have found that:

(A) a target obtained by pulverizing an ingot, which is obtained by melting and casting and has a composition including Al: 20 to 50 mass %, Eu: 1 to 10 mass %, and the remainder containing Ba and inevitable impurities, so as to give an alloy powder, and then sintering or hot pressing this alloy powder in a vacuum, has an intermetallic compound phase of Ba in which Eu is solid-solubilized and Al, and thus the target does not oxidize in a short period of time even when allowed to stand in the atmosphere because Eu is solid-solubilized in Ba, thereby maintaining high strength even when the target is allowed to stand in the atmosphere for a long time;

(B) the intermetallic compound phase of Ba in which Eu is solid-solubilized and Al, includes an intermetallic compound phase in which Eu forms a solid solution with Ba in a $BaAl_4$ intermetallic compound and an intermetallic compound phase in which Eu forms a solid solution with Ba in a $Ba_7Al_{13}$ intermetallic compound; and (C) oxidization is readily caused when a simple Ba phase and simple Eu phase are remaining in the basis metal, thereby deteriorating the strength of the target, and thus it is preferable that the simple Ba phase and simple Eu phase not remain in the basis metal.

The present invention is accomplished on the basis of these findings, and includes:

(1) a high strength sputtering target for forming a phosphor film in an electroluminescence element, which has a chemical composition of Al: 20 to 50 mass %, Eu: 1 to 10 mass %, and the remainder containing Ba and inevitable impurities, and has a structure wherein Ba in which Eu is solid-solubilized and Al form an intermetallic compound phase;

(2) the high strength sputtering target for forming a phosphor film in an electroluminescence element as set forth in said (1), wherein the intermetallic compound phase of Ba in which said Eu is solid-solubilized and Al includes an intermetallic compound phase in which said Eu forms a solid solution with Ba in a $BaAl_4$ intermetallic compound and an intermetallic compound phase in which said Eu forms a solid solution with Ba in a $Ba_7Al_{13}$ intermetallic compound.

The present inventors have conducted further studies, and as a result, they have found that:

(D) it is not preferable for a simple Ba phase and simple Eu phase to be dispersed in the basis metal, in a high strength sputtering target for forming a phosphor film in an electroluminescence element according to the invention. However, even if a simple Al phase is dispersed, Al does not rapidly oxidize, thereby not reducing the strength, but in contrast, the toughness of the target improves by a uniform simple Al phase dispersion in the basis metal and causes no chipping when cutting the target.

Accordingly, the invention includes:

(3) a high strength sputtering target for forming a phosphor film in an electroluminescence element, which has a composition including Al: 20 to 50 mass %, Eu: 1 to 10 mass %, and the remainder containing Ba and inevitable impurities, and has a structure in which a simple Al phase is dispersed in a basis metal including an intermetallic compound phase of Ba in which Eu is solid-solubilized and Al; and (4) the high strength sputtering target for forming a phosphor film in an electroluminescence element as set forth in said (3), wherein the intermetallic compound phase of Ba in which Eu is solid-solubilized and Al, includes an intermetallic compound phase in which Eu forms a solid solution with Ba in a $BaAl_4$ intermetallic compound and an intermetallic phase compound in which Eu forms a solid solution with Ba in a $Ba_7Al_{13}$ intermetallic compound.

In order to produce a high strength sputtering target for forming a phosphor film of the invention, to begin with, a $BaAl_4$ intermetallic compound, metal Ba, metal Al, and metal Eu are prepared as raw materials, the materials are introduced into an alumina pot and dissolved in a high frequency vacuum melting furnace in an argon gas atmosphere, the thus obtained molten liquid is cast in a mold to prepare an ingot, the obtained ingot is pulverized in high-purity argon gas blowing to give a powder having a particle size of 500 μm or less, the powder is hot pressed under conditions of the temperature: 500 to 800° C. and pressure: 10 to 50 MPa for 1 to 8 hours to produce a hot-pressed body, and then the hot-pressed body is cut to prepare a sputtering target for forming a phosphor film in an electroluminescence element.

Further, a $BaAl_4$ intermetallic compound and metal Eu are prepared as raw materials which are used to prepare an intermetallic compound powder in which Eu forms a solid solution with Ba in a $BaAl_4$ intermetallic compound in the same manner as described above. At the same time, a $Ba_7Al_{13}$ intermetallic compound and metal Eu are prepared as raw materials which are used to prepare an intermetallic compound powder in which Eu forms a solid solution with Ba in a $Ba_7Al_{13}$ intermetallic compound in the same manner as described above. Both powders are mixed and hot-pressed to give a hot-pressed body and then the body is subjected to cutting to obtain a sputtering target for forming a phosphor film in an electroluminescence element.

The component composition of a high strength sputtering target for forming a phosphor film in an electroluminescence element according to the invention has to be Al: 20 to 50 mass %, Eu: 1 to 10 mass %, and the remainder containing Ba and inevitable impurities, and this range is derived by calculation to form a europium-doped barium thioaluminate phosphor film ($BaAl_2S_4$:Eu). Since this component composition is already known, explanation on the reasons for this limitation will be omitted.

In addition, available metal Ba as the raw material is preferably a high purity material. Generally available metal Ba as an industrial material includes alkaline earth metals as inevitable impurities, mainly Sr, Ca, and Mg. Consequently, in a high strength sputtering target for forming a phosphor film in an electroluminescence element, these alkaline earth metals are included, mainly Sr, Ca and Mg as inevitable impurities, and a high strength sputtering target for forming a phosphor film in an electroluminescence element according to the invention also includes a high strength sputtering target for forming a phosphor film in an electroluminescence element containing Sr: 2 mass % or less, Ca: 1 mass % or less and Mg: 0.5 mass % or less as inevitable impurities.

Advantages of the Invention

According to a sputtering method, a phosphor film in an electroluminescence element with a large dimension can be manufactured at high speed, and the production cost thereof is also reduced, thereby greatly contributing to the development in the display industry.

BEST MODE FOR CARRYING OUT THE INVENTION

EXAMPLE 1

As raw materials, a $BaAl_4$ intermetallic compound, metal Ba and metal Eu were prepared, the materials were introduced into an alumina pot and dissolved at the temperature of 1200° C. in a high frequency vacuum melting furnace in an argon gas atmosphere, the thus obtained molten liquid was cast in a mold to prepare an ingot, the obtained ingot was pulverized in high-purity argon gas blowing to give a powder having an average particle size of 70 μm, and the powder was hot pressed under conditions of the temperature: 650° C., pressure: 40 MPa for 2 hours to produce hot pressed targets 1 to 5 of the invention and comparative hot pressed targets 1 to 3, which had the component compositions as shown in Table 1. The hot pressed targets 1 to 5 of the invention and comparative hot pressed targets 1 to 3 were cut out in blocks and X-ray diffraction was performed. The results are shown in Table 1.

Next, test pieces for a transverse rupture test each having a size of 4 mm (width)×40 mm (length)×3 mm (thickness) were prepared by cutting out the hot pressed targets. These test pieces for the transverse rupture test were allowed to stand in the atmosphere for 12 hours, and thereafter a three-point bending test was performed in accordance with JIS R-1601 to determine the transverse rapture strength. The results are shown in Table 1.

CONVENTIONAL EXAMPLE 1

As raw materials, Al powder, Ba powder, and Eu powder were prepared, these raw powders were hot-pressed under conditions of the temperature: 650° C., pressure: 40 MPa for 2 hours to prepare conventional hot pressed targets 1 to 5 having the component compositions as shown in Table 1, and the conventional hot pressed targets 1 to 5 were cut out in blocks and X-ray diffraction was performed. The results are shown in Table 1.

Next, test pieces for the transverse rupture test each having a size of 4 mm (width)×40 mm (length)×3 mm (thickness) were prepared by cutting out the hot pressed targets. These test pieces for the transverse rupture test were allowed to stand in the atmosphere for 12 hours, and thereafter a three-point bending test was performed in accordance with JIS R-1601 to determine the transverse rupture strength. The results are shown in Table 1.

TABLE 1

| Hot Pressed Targets | | Component Composition (mass %) | | | Detection Results of Peak Strength by X-ray Diffraction | | | | | Transverse Rupture Strength of Targets after 12 Hours (MPa) |
|---|---|---|---|---|---|---|---|---|---|---|
| | | Al | Eu | Ba and Inevitable Impurities | $BaAl_4$ Intermetallic Compound Phase | $Ba_7Al_{13}$ Intermetallic Compound Phase | Simple Al Phase | Simple Eu Phase | Simple Ba Phase | |
| Present Invention | 1 | 40 | 1 | Remainder | Exist | Exist | None | None | None | 26 |
| | 2 | 40 | 2 | Remainder | Exist | Exist | None | None | None | 23 |
| | 3 | 36.5 | 3.5 | Remainder | Exist | Exist | None | None | None | 24 |
| | 4 | 34 | 4 | Remainder | Exist | Exist | None | None | None | 24 |
| | 5 | 31 | 5 | Remainder | Exist | Exist | None | None | None | 22 |
| Comparative Ex. | 1 | 40 | 30 | Remainder | Exist | Exist | None | Exist* | None | 12 |
| | 2 | 20 | 1 | Remainder | Exist | Exist | None | None | Exist* | 8 |
| | 3 | 10 | 20 | Remainder | Exist | Exist | None | Exist* | Exist* | 9 |
| Conventional Ex. | 1 | Same as the Present Invention 1 | | | None | None | Exist | Exist* | Exist* | 4 |
| | 2 | Same as the Present Invention 2 | | | None | None | Exist | Exist* | Exist* | 3 |
| | 3 | Same as the Present Invention 3 | | | None | None | Exist | Exist* | Exist* | 3 |
| | 4 | Same as the Present Invention 4 | | | None | None | Exist | Exist* | Exist* | 2 |
| | 5 | Same as the Present Invention 5 | | | None | None | Exist | Exist* | Exist* | 4 |

*indicates the condition which is out of the range of the present invention.

From the results of Table 1, it is understood that:

(a) a structure of the hot pressed targets 1 to 5 of the invention includes $BaAl_4$ intermetallic compound phase and $Ba_7Al_{13}$ intermetallic compound phase, and Eu was contained in a form of being solid-solubilized in Ba, considering the results that peaks of the $BaAl_4$ intermetallic compound phase and $Ba_7Al_{13}$ intermetallic compound phase were detected, and peaks of the simple Al phase, simple Ba phase, and simple Eu phase were not detected;

(b) the comparative hot pressed targets 1 to 3, from which the $BaAl_4$ intermetallic compound phase and $Ba_7Al_{13}$ intermetallic compound phase were detected and peaks of the simple Ba phase and/or the simple Eu phase were also detected, had deteriorated strength when they were allowed to stand for 12 hours; and (c) the conventional hot pressed targets 1 to 5 obtained by hot pressing elemental metal powders such as an Al powder, Ba powder, and Eu powder, were extremely deteriorated in the strength, although each component composition of these is same as that of the hot pressed targets 1 to 5 of the invention, when the conventional hot pressed targets 1 to 5 from which all peaks of $BaAl_4$ intermetallic compound phase, $Ba_7Al_{13}$ intermetallic compound phase, simple Al phase, simple Ba phase, and simple Eu phase were detected, were allowed to stand in the atmosphere for 12 hours.

EXAMPLE 2

As raw materials, a BaAl$_4$ intermetallic compound, metal Ba, and metal Eu were prepared, the materials were introduced into an alumina pot and dissolved at the temperature of 1200° C. in a high frequency vacuum melting furnace in an argon gas atmosphere, the thus obtained molten liquid was cast in a mold to prepare an ingot, the obtained ingot was pulverized in high-purity argon gas blowing to give a powder having an average particle size of 70 μm, the powder was mixed with an Al powder having an average particle size of 100 μm, and the obtained mixed powder was hot-pressed under conditions of the temperature: 650° C., pressure: 40 MPa for 2 hours to produce hot pressed targets 6 to 10 of the invention, which had the component compositions as shown in Table 2. The hot pressed targets 6 to 10 of the invention were cut out in blocks and X-ray diffraction was performed. The results are shown in Table 2.

Next, test pieces for the transverse rupture test each having a size of 4 mm (width)×40 mm (length)×3 mm (thickness) were prepared by cutting out the hot pressed targets. These test pieces for the transverse rupture test were allowed to stand in the atmosphere for 12 hours, and thereafter a three-point bending test was performed in accordance with JIS R-1601 to determine the transverse rupture strength. The results are shown in Table 2.

In addition, the hot pressed targets 6 to 10 of the invention were subjected to a dry cutting process under conditions of a cutting depth of 2.5 times deeper than Example 1: 0.5 mm, feeding speed: 40 m/min, rotation speed: 540 RPM, and inverter: 20 HZ, using a milling machine to prepare targets 6 to 10 of the invention, which each had a size of 200 mm (width)×350 mm (length)×10 mm (thickness) and a component composition as shown in Table 2. The number of chippings giving a size of 1 mm or more which were formed on the cutting surface was measured, and the results are shown in Table 2.

From the results of Table 2, it is understood that the hot pressed targets 6 to 10 of the present invention having a structure from which peaks of the BaAl$_4$ intermetallic compound phase and Ba$_7$Al$_{13}$ intermetallic compound phase were detected, peak of the simple Al phase was also detected, but peaks of the simple Ba phase and simple Eu phase were not detected, can maintain high strength even when they were allowed to stand in the atmosphere for 12 hours. Furthermore, with regard to the hot pressed targets 6 to 10 of the present invention from which peak of the simple Al was detected, the cutting performance was improved and no chipping was caused during cutting under severe conditions.

The invention claimed is:

1. A sputtering target for forming a phosphor film in an electroluminescence element, comprising:
   a composition of Al: 20 to 50 mass %, Eu: 1 to 5 mass %, and the remainder containing Ba and inevitable impurities; and
   a structure in which Ba and Al form an intermetallic compound phase, and Eu is solid-solubilized in Ba,
   wherein a simple Eu phase does not remain in the sputtering target.

2. The sputtering target for forming a phosphor film in an electroluminescence element according to claim 1,
   wherein the intermetallic compound phase of Ba in which Eu is solid-solubilized and Al comprises an intermetallic compound phase in which Eu forms a solid solution with Ba in a BaAl$_4$ intermetallic compound and an intermetallic compound phase in which Eu forms a solid solution with Ba in a Ba$_7$Al$_{13}$ intermetallic compound.

3. A sputtering target for forming a phosphor film in an electroluminescence element, comprising:
   a composition of Al: 20 to 50 mass %, Eu: 1 to 5 mass %, and the remainder containing Ba and inevitable impurities; and
   a structure in which a simple Al phase is dispersed in a basis metal including an intermetallic compound phase formed by Ba and Al, and Eu is solid-solubilized in Ba,
   wherein a simple Eu phase does not remain in the sputtering target.

4. The sputtering target for forming a phosphor film in an electroluminescence element according to claim 3,
   wherein the intermetallic compound phase of Ba in which Eu is solid-solubilized and Al comprises an intermetallic compound phase in which Eu forms a solid solution with Ba in a BaAl$_4$ intermetallic compound and an intermetallic compound phase in which Eu forms a solid solution with Ba in a Ba$_7$Al$_{13}$ intermetallic compound.

* * * * *

TABLE 2

| Hot Pressed Targets | | Component Composition (mass %) | | | Detection Results of Peak Strength by X-ray Diffraction | | | | | Transverse Rupture Strength of Targets after 12 Hours (MPa) | Number of Chipping Measuring over 1 mm (piece) |
|---|---|---|---|---|---|---|---|---|---|---|---|
| | | Al | Eu | Ba and Inevitable Impurities | BaAl$_4$ Intermetallic Compound Phase | Ba$_7$Al$_{13}$ Intermetallic Compound Phase | Simple Al Phase | Simple Eu Phase | Simple Ba Phase | | |
| Present Invention | 6 | 40 | 1 | Remainder | Exist | Exist | Exist | None | None | 30 | 0 |
| | 7 | 40 | 2 | Remainder | Exist | Exist | Exist | None | None | 30 | 0 |
| | 8 | 36.5 | 3.5 | Remainder | Exist | Exist | Exist | None | None | 29 | 0 |
| | 9 | 34 | 4 | Remainder | Exist | Exist | Exist | None | None | 29 | 1 |
| | 10 | 31 | 5 | Remainder | Exist | Exist | Exist | None | None | 28 | 1 |